(12) United States Patent
Wu

(10) Patent No.: US 10,128,794 B2
(45) Date of Patent: Nov. 13, 2018

(54) FEEDBACK COMPENSATED OSCILLATOR

(71) Applicant: MACRONIX INTERNATIONAL CO., LTD., Hsinchu (TW)

(72) Inventor: Hsien-Hung Wu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 124 days.

(21) Appl. No.: 15/280,892

(22) Filed: Sep. 29, 2016

(65) Prior Publication Data
US 2018/0091096 A1 Mar. 29, 2018

(51) Int. Cl.
H03B 5/24 (2006.01)
H03K 3/0231 (2006.01)
H03K 4/501 (2006.01)

(52) U.S. Cl.
CPC .............. *H03B 5/24* (2013.01); *H03K 3/0231* (2013.01); *H03K 4/501* (2013.01)

(58) Field of Classification Search
CPC .......... H03B 5/24; H03K 3/0231; H03K 4/12; H03K 4/50; H03K 4/501
USPC .................................................. 331/111, 143
See application file for complete search history.

(56) References Cited

U.S. PATENT DOCUMENTS

| | | | |
|---|---|---|---|
| 4,963,840 A * | 10/1990 | Thommen | H03K 3/0231 331/111 |
| 5,670,915 A * | 9/1997 | Cooper | H03K 3/0231 331/111 |
| 5,982,241 A | 11/1999 | Nguyen et al. | |
| 6,157,270 A | 12/2000 | Tso | |
| 7,227,422 B2 | 6/2007 | Yarborough, Jr. | |
| 7,251,158 B2 | 7/2007 | Hsia et al. | |
| 7,385,453 B2 | 6/2008 | Nervegna | |
| 7,432,771 B2 | 10/2008 | Chui | |
| 7,654,736 B1 | 2/2010 | Walker | |

(Continued)

OTHER PUBLICATIONS

Bui, et al., "Design of a High-Speed Differential Frequency-to-Voltage Converter and Its Application in a 5-GHz Frequency-Locked Loop," in IEEE Transactions on Circuits and Systems I: Regular Papers, vol. 55, No. 3, pp. 766-774, Apr. 2008.

(Continued)

*Primary Examiner* — Levi Gannon
(74) *Attorney, Agent, or Firm* — Haynes Beffel & Wolfeld LLP

(57) ABSTRACT

An oscillator produces an oscillator output signal usable as a clock signal, otherwise as a frequency reference on an integrated circuit. The oscillator includes an RC network with a voltage-controlled element, such as a voltage-controlled resistor, voltage-controlled capacitor or a combination including a voltage-controlled resistor and voltage-controlled capacitor. Also, a tunable element having an adjustable resistance determined by a first static parameter is included in the RC network. The oscillator also includes a feedback circuit which can include a frequency-to-voltage converter. The feedback circuit generates a control signal for the voltage-controlled element. The feedback circuit includes a feedback reference circuit having a reference output determined by a second static parameter, and a loop amplifier responsive to the reference output and the oscillator output signal.

19 Claims, 11 Drawing Sheets

(56) References Cited

U.S. PATENT DOCUMENTS

| | | | |
|---|---|---|---|
| 7,719,371 | B2 | 5/2010 | Pernia et al. |
| 8,058,941 | B2 | 11/2011 | Kurogo et al. |
| 8,212,624 | B2 | 7/2012 | Tokunaga et al. |
| 8,497,741 | B2 | 7/2013 | Pedersen et al. |
| 8,878,621 | B2 | 11/2014 | Matsuzaki et al. |
| 8,988,157 | B2 | 3/2015 | Tokairin |
| 9,660,628 | B2 * | 5/2017 | Almazan ............... H03K 3/0231 |
| 9,829,911 | B2 * | 11/2017 | Yayama .................... G06F 1/08 |
| 9,831,831 | B2 * | 11/2017 | Savanth .................... H03B 5/24 |
| 2010/0013566 | A1 * | 1/2010 | Kim ....................... H03K 4/502 331/111 |
| 2012/0249114 | A1 | 10/2012 | Sako et al. |
| 2012/0319789 | A1 * | 12/2012 | Bhowmik ............ H03K 3/0231 331/143 |
| 2013/0038364 | A1 * | 2/2013 | Tokairin ................ H03K 4/502 327/156 |
| 2013/0176082 | A1 | 7/2013 | Ishikawa |
| 2014/0218123 | A1 | 8/2014 | Wei et al. |
| 2015/0333736 | A1 * | 11/2015 | Wu ........................ H03K 3/011 327/291 |
| 2016/0191067 | A1 * | 6/2016 | Samala ................. H03L 7/0995 331/25 |
| 2016/0308512 | A1 * | 10/2016 | Ruotsalainen ......... H03K 3/012 |

OTHER PUBLICATIONS

Carter, Bruce and Thomas R. Brown, Texas Instruments Application Report SBOA092A, "Handbook of Operational Amplifier Applications," Oct. 2001, 94 pages.

Johns, David A. and Ken Martin, Analog Integrated Circuit Design, 1st ed, Chap. 16 pp. 648-657, MA: Addison Wesley, 1997.

Lee, et al., "A 1.4-µW 24.9-ppm/° C Current Reference With Process-Insensitive Temperature Compensation in 0.18-µm CMOS," in IEEE Journal of Solid-State Circuits, vol. 47, No. 10, pp. 2527-2533, Oct. 2012.

Sato, et al., "Frequency-to-voltage converter for temperature compensation of CMOS RC relaxation oscillator," 2014 IEEE Asia Pacific Conference on Circuits and Systems (APCCAS), Ishigaki, Nov. 17-20, 2014, pp. 41-44.

* cited by examiner

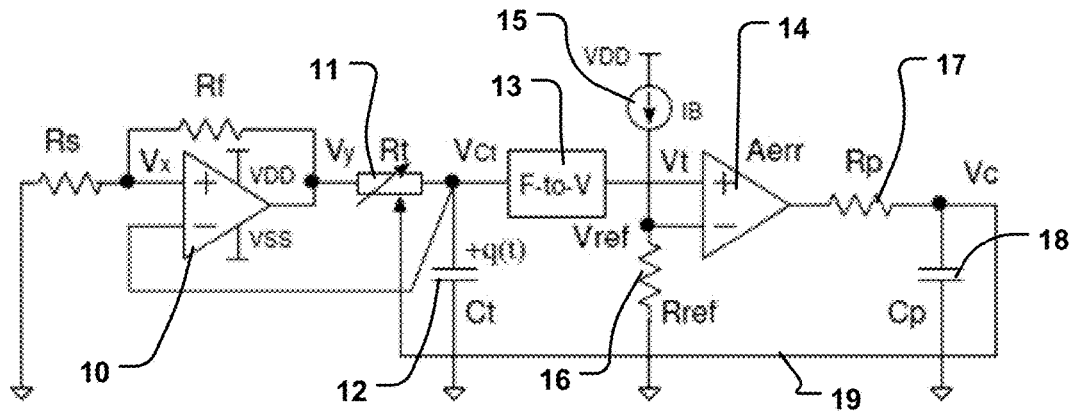
Fig. 1 – PRIOR ART
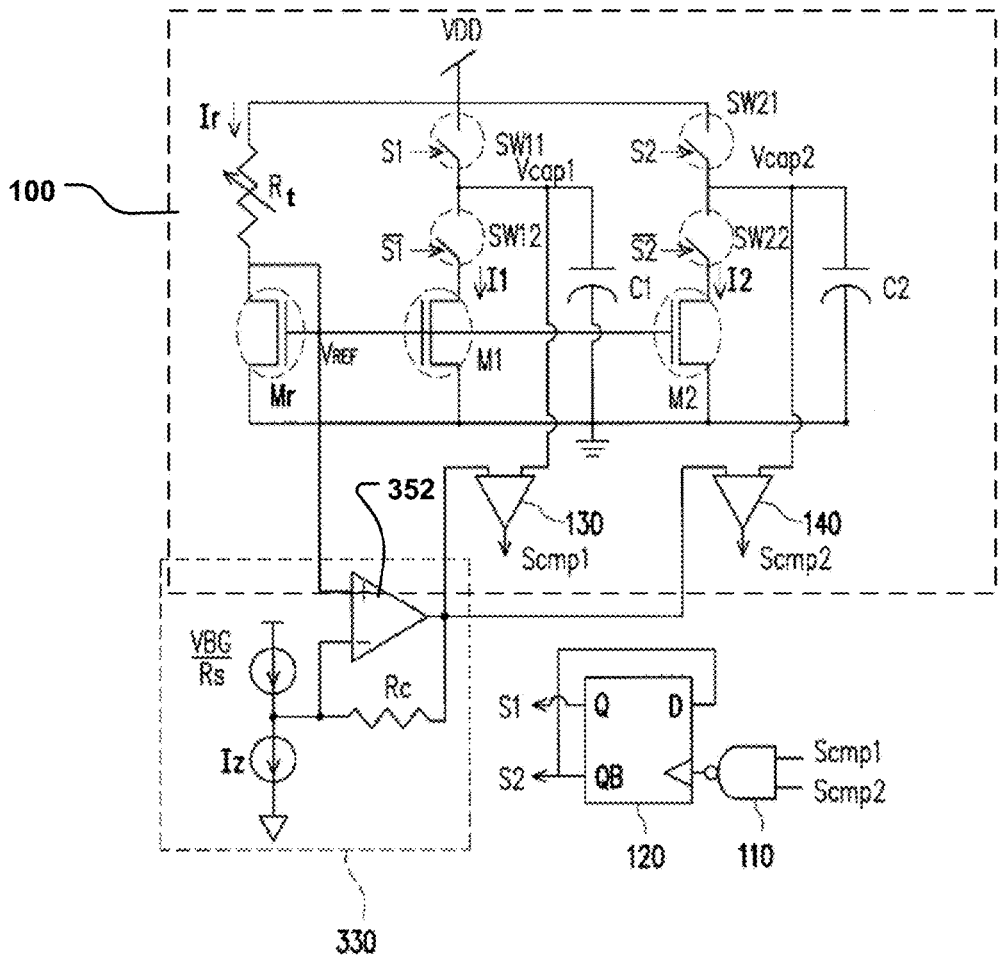
Fig. 2 – RELATED ART

Rtot = Pass_R + Rch_Dep_MOS

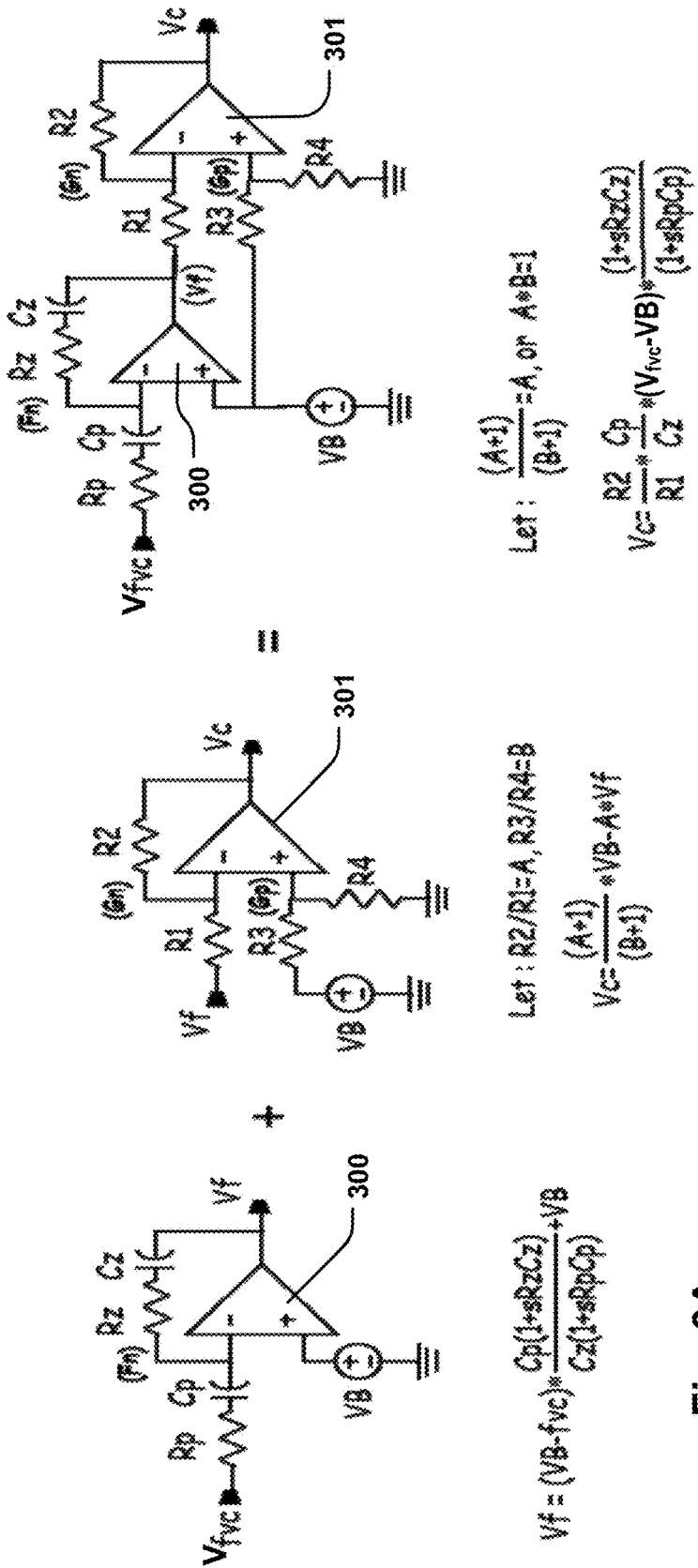

US 10,128,794 B2

FEEDBACK COMPENSATED OSCILLATOR

BACKGROUND

Technological Field

The present technology relates to feedback-stabilized oscillators, including such oscillators formed on an integrated circuit and providing a stable operating frequency for circuitry on the integrated circuit.

Description of Related Art

In many integrated circuit based systems, it is important to provide an oscillator output signal with a stable operating frequency. In some systems, external clock reference circuits, such as crystal oscillators are used to stabilize an oscillator producing an on-chip clock. In other embodiments, an off-chip crystal reference may not be practical. So technology is being developed to provide stabilized on-chip oscillators.

For example, FIG. 1 shows a prior art model of an RC relaxation oscillator architecture that is reported in Sato, et al., "Frequency-to-Voltage Converter for Temperature Compensation of CMOS RC Relaxation Oscillator," Asia Pacific Conference on Circuits and Systems (APCCAS), 2014 IEEE, 17-20 Nov. 2014, pp. 41-44. In this model, a differential amplifier 10 is connected to a resistance/capacitance network having a voltage-controlled resistor 11 with resistance $R_t$ and a capacitor 12 having capacitance $C_t$. A feedback resistor having a value $R_f$ is connected between the output $V_y$ and the positive input of the differential amplifier 10, and a source resistor $R_s$ is connected between the positive input and ground. A voltage $V_x$ is produced at the positive input of the differential amplifier 10, which is a function of the voltage $V_y$ at the output of the differential amplifier 10. Also, voltage $V_{Ct}$ at a node of the capacitor 12 is connected to the negative input of the differential amplifier 10. As the voltage $V_{Ct}$ oscillates, it crosses the level of the voltage $V_x$ causing the voltage $V_y$ to fluctuate between the supply voltages $V_{DD}$ and $V_{SS}$. According to the model shown in FIG. 1, the voltage-controlled resistor 11 is controlled by a feedback loop including a frequency-to-voltage converter 13 which produces a voltage $V_f$, an error amplifier 14 and a low pass filter including resistor 17 having a value $R_p$ and a capacitor 18 having value $C_p$. A reference voltage $V_{REF}$ is supplied to the negative input of the error amplifier 14, which is produced by a current source 15 and a reference resistor 16 connected in series between the supply potential $V_{DD}$ and ground. The resulting control voltage $V_c$ applied on line 19 is used to control the voltage-controlled resistor 11.

The oscillator model of FIG. 1 uses a voltage-controlled resistor (VCR) combined with a feedback loop to stabilize the output frequency. Given an ideal feedback loop, frequency errors due to variations of RC constant and comparator delays within the oscillator could be reduced using this approach. However if the loop parameters, like $V_{REF}$ (which is equal to $IB*R_{REF}$ in this configuration), the gain of the loop error amplifier $A_{err}$ and the coefficient of the frequency-to-voltage converter F-to-V may not be ideal. Any non-ideality from these parameters would result in variations in the output frequency. For example, the drift of $R_{ref}$ due to change in temperature can cause undesirable changes in the oscillating frequency.

In addition, the oscillator model in FIG. 1 requires $V_{SS}=-V_{DD}$, to provide a $V_{DD}$-independent frequency. This constraint may not be practical, particularly in single powered systems.

At higher frequencies, greater than 10 MHz for example shown in Sato et al., the prior art clock circuits may not be able to maintain stable clock frequencies with the existing feedback techniques.

Therefore, it is desirable to provide an oscillator architecture technology addressing one or more of the above-mentioned limitations.

SUMMARY

A clock circuit and a method for manufacturing a clock circuit are described herein.

The clock circuit comprises an oscillator that produces an oscillator output signal usable as a clock signal, otherwise as a frequency reference on an integrated circuit. The oscillator includes an RC network with a voltage-controlled element, such as a voltage-controlled resistor, voltage-controlled capacitor or a combination including a voltage-controlled resistor and voltage-controlled capacitor. Also, a tunable element having an adjustable resistance based on a first static parameter or parameter set is included in the RC network. The oscillator also includes a feedback circuit which generates a control signal for the voltage-controlled element. The feedback circuit includes a feedback reference circuit having a stabilized reference output that can have a level based on a second static parameter or parameter set (e.g. a parameter used to set a static resistance used in the feedback reference circuit), and a loop amplifier responsive to the reference output and the oscillator output signal. Also, the feedback circuit can include a frequency-to-voltage converter.

Embodiments of the clock circuit can operate at lower frequencies of 24 MHz and less. Other embodiments can operate at frequencies critical for current high speed circuits, at 24 MHz and higher, including at up to as high as 25 GHz.

The loop amplifier in the feedback circuit can include an error amplifier and a low pass filter, where one or both of the error amplifier and the low pass filter are responsive to the reference output.

The voltage-controlled element can be implemented using a depletion mode NMOS transistor as a voltage-controlled resistor in some embodiments. The voltage-controlled element can be implemented using a varactor as a voltage-controlled capacitor in some embodiments.

The first static parameter and the second static parameter can be stored in nonvolatile memory on the same integrated circuit as the clock circuit.

An embodiment of the clock circuit can comprise an RC relaxation oscillator. The RC network in the clock circuit can include switches responsive to the oscillator output signal to alternatively charge and discharge capacitors in the RC network. In the RC network, a first node has a voltage that is a function of charge on one of the capacitors, and a second node has a voltage that is a function of charge on another one of the capacitors. The oscillator can include a clock amplifier having a signal input coupled to the first and second nodes in the RC network and an output. The clock amplifier amplifies the differences between the voltages on the first and second nodes and a reference voltage to produce the oscillator output signal.

In embodiments described, the loop amplifier includes a low pass amplifier stage and an error amplifier stage, both of which are implemented using amplifiers such as operational amplifiers. In the low pass amplifier stage, feedback for the amplifiers can be implemented using an RC circuit whereby a gain and frequency response of the low pass amplifier stage are a function of passive resistors and capacitors. Also, the error amplifier stage can include resistive feedback whereby the gain of the error amplifier stage is a function of passive resistors.

In some embodiments, the loop amplifier comprises an amplifier having adjustable gain. The gain can be set during normal operation at a first value, and can be configured to increase the gain during a calibration mode.

A method for manufacturing an integrated circuit is described and includes forming an oscillator as described above, and in which the adjustable resistor and the adjustable reference circuit are trimmed. In general, a method as described herein comprises:

forming an oscillator that produces an oscillator output signal, the oscillator including an RC network with a voltage-controlled element, and a tunable element having an adjustable resistance based on a first static parameter;

forming a feedback circuit which generates a control signal for the voltage-controlled element, the feedback circuit including an adjustable feedback reference circuit having a reference output based on a second static parameter, and a loop amplifier responsive to the reference output and the oscillator output signal;

setting the first static parameter while applying a fixed voltage to control the voltage-controlled element while the feedback circuit is disconnected from the oscillator output signal, to set the oscillator output signal to a frequency matching a target frequency;

coupling the feedback circuit to the oscillator output signal while applying a fixed voltage to control the voltage-controlled element, and setting the second static parameter so that the control voltage matches a target voltage; and connecting the control signal from the feedback circuit to the voltage-controlled element.

Other aspects and advantages of the technology described herein can be seen on review of the drawings, the detailed description and the claims, which follow.

BRIEF DESCRIPTION OF THE DRAWINGS

FIG. 1 illustrates a prior art model for an RC relaxation oscillator using a voltage-controlled resistor.

FIG. 2 is a schematic diagram of related technology including an RC relaxation oscillator with temperature compensation for a reference voltage.

FIGS. 6A-6C illustrate the structure of a feedback circuit for use in a system like that of FIG. 3 including a low pass filter and an error amplifier.

DETAILED DESCRIPTION

A detailed description of embodiments of the technology is provided with reference to the FIGS. 2-14.

Figure 4:
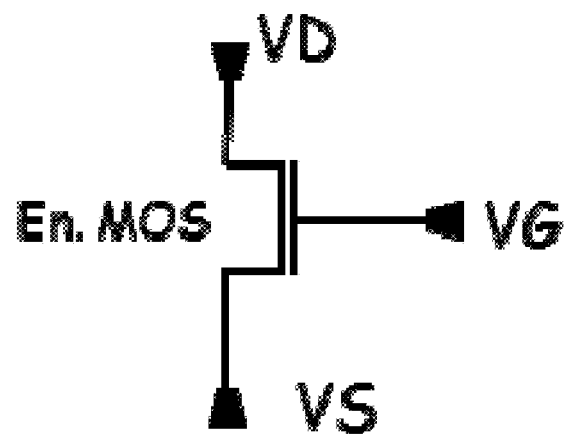
FIG. 4 illustrates an enhancement mode NMOS transistor which can be used as a voltage-controlled resistor.

FIG. 2 shows related technology, It is a copy of FIG. 4 from U.S. Patent Application Publication No. US 2015/0333736, entitled *Method And Circuit For Temperature Dependence Reduction Of A RC Clock Circuit*, published Nov. 19, 2015, which is commonly owned by the present applicant now, and was commonly owned by the present applicant at the time the present application is being filed, and at the time of invention. U.S. Patent Application Publication No. US 2015/0333736 is incorporated by reference as if fully set forth herein.

FIG. 2 is a schematic diagram illustrating an RC relaxation oscillator comprising a combination of an RC clock circuit 100 and a temperature dependence reduction circuit 330.

In the RC clock circuit 100, a resistance/capacitance network includes resistor $R_t$, capacitors C1 and C2, and switches SW11, SW12, SW21 and SW22. Transistors Mr, M1 and M2 are configured in a current mirror fashion so that the current through the resistor $R_t$ and the transistor Mr is mirrored through the switch networks driven by transistors M1 and M2. A voltage $V_{REF}$ is generated on the gate of the transistor Mr. The differential amplifier is implemented using the comparators 130 and 140, the outputs of which are coupled through NAND gate 110 to the D flip-flop 120. Clock signals S1 and S2 are generated at the outputs of the flip-flop 120, and are used in controlling the switches in the resistance/capacitance network.

The rate of charging and discharging the capacitors C1 and C2 determines the operating frequency, and is determined to a substantial degree by an RC time constant. A clock trimming resistor $R_t$ controls a current Ir flowing through a transistor Mr. Transistors M1, M2, and Mr are substantially the same so as to form current mirrors to equalize currents I1, I2, and Ir. The reference voltage $V_{REF}$ is a bias voltage of transistors M1, M2, and Mr and is also used to control alternating charging and discharging of capacitors C1 and C2. Capacitors C1 and C2 can have a same capacitance value. A switching stage includes a pair of comparators 130 and 140, a NAND gate 110, a D flip-flop 120, and four switches SW11, SW12, SW21, and SW22. The Comparator 130 compares the voltage $V_{cap1}$ of the capacitor C1 with the reference voltage $V_{REF}$ and generates a signal $S_{cmp1}$ accordingly. The signal $S_{cmp1}$ is then sent to the NAND gate 110. In this example, if the voltage $V_{cap1}$ is higher than the reference voltage $V_{REF}$, the signal $S_{cmp1}$ is at a high level, otherwise the signal $S_{cmp1}$ is at a low level. The comparator 140 compares the voltage $V_{cap2}$ of the capacitor C2 with the reference voltage $V_{REF}$ and generates a signal $S_{cmp2}$ accordingly, and the signal $S_{cmp2}$ is then sent to the NAND gate 110. In this example, if the voltage $V_{cap2}$ is higher than the reference voltage $V_{REF}$, the signal $S_{cmp2}$ is at a high level, otherwise the signal $S_{cmp2}$ is at a low level.

The signal S1 output from the D flip-flop 120 is used to enable or disable switches SW11 and SW12. For example, if the signal S1 is at a high level, the switch SW11 is enabled and the switch SW12 is disabled, otherwise the switch SW11 is disabled and the switch SW12 is enabled. The signal S2 output from the D flip-flop 120 is used to enable or disable switches SW21 and SW22. For example, if the signal S2 is at a high level, the switch SW21 is enabled and the switch SW22 is disabled, otherwise the switch SW21 is disabled and the switch SW22 is enabled. The switching alternates the charging and discharging of the capacitors C1 and C2, producing an oscillating voltage having a frequency that is a function of the capacitance C and the currents I1 and I2. The currents I1 and I2 are in turn a function of the voltage $V_{REF}$, that is determined by the resistor $R_t$, the current Ir and the threshold of Mr.

The temperature dependence reduction circuit 330 generates the voltage ($V_{REF}+V_c$) to control the alternating charge and discharge of the capacitors C1 and C2.

In the circuit 330, a resistor Rc is coupled between a negative input end and an output end of an operational amplifier 352, such that the voltages on the negative input end and the positive input end of the operation amplifier 352 can be equalized to $V_{REF}$ by a virtual short circuit effect of the operation amplifier 352. A temperature coefficient of the third resistor $R_c$ is substantially the same as the temperature coefficient of the clock trimming resistor $R_t$ of the RC clock circuit 100. As a result, the voltage at the negative input of the operational amplifier 352 is driven to be equal to $V_{REF}$. A zero temperature coefficient current Iz provided by a first current source flows from the output end of the operation amplifier 352 through the third resistor $R_c$ to the ground. The current source Iz can be embodied by a combination of a proportional-to-absolute temperature (PTAT) current and a complementary-to-absolute temperature (CTAT) current.

Also, a current source $V_{BG}/R_s$ including a bandgap reference in this example, flows from the power voltage source through the resistor $R_c$ to an output end of an operation amplifier 352. A temperature coefficient of the resistor $R_s$ can be also substantially the same as the temperature coefficient of the clock trimming resistor $R_t$ of the $R_C$ clock circuit 100.

As a result of this configuration, the voltage on the output of the operational amplifier 352 can be maintained at about $V_{REF}+V_c$, compensating for temperature variations in the trimming resistor $R_t$, where the voltage $V_c$ represents the voltage across the resistor $R_c$. Also an enable/disable signal is applied to the circuit on line 199. This signal can be implemented for example by a switch or switches that control the power supply distribution in the oscillator circuitry, and used to establish a low power standby mode for the oscillator in which some or all of the circuit elements in the circuitry are turned off.

Figure 3:
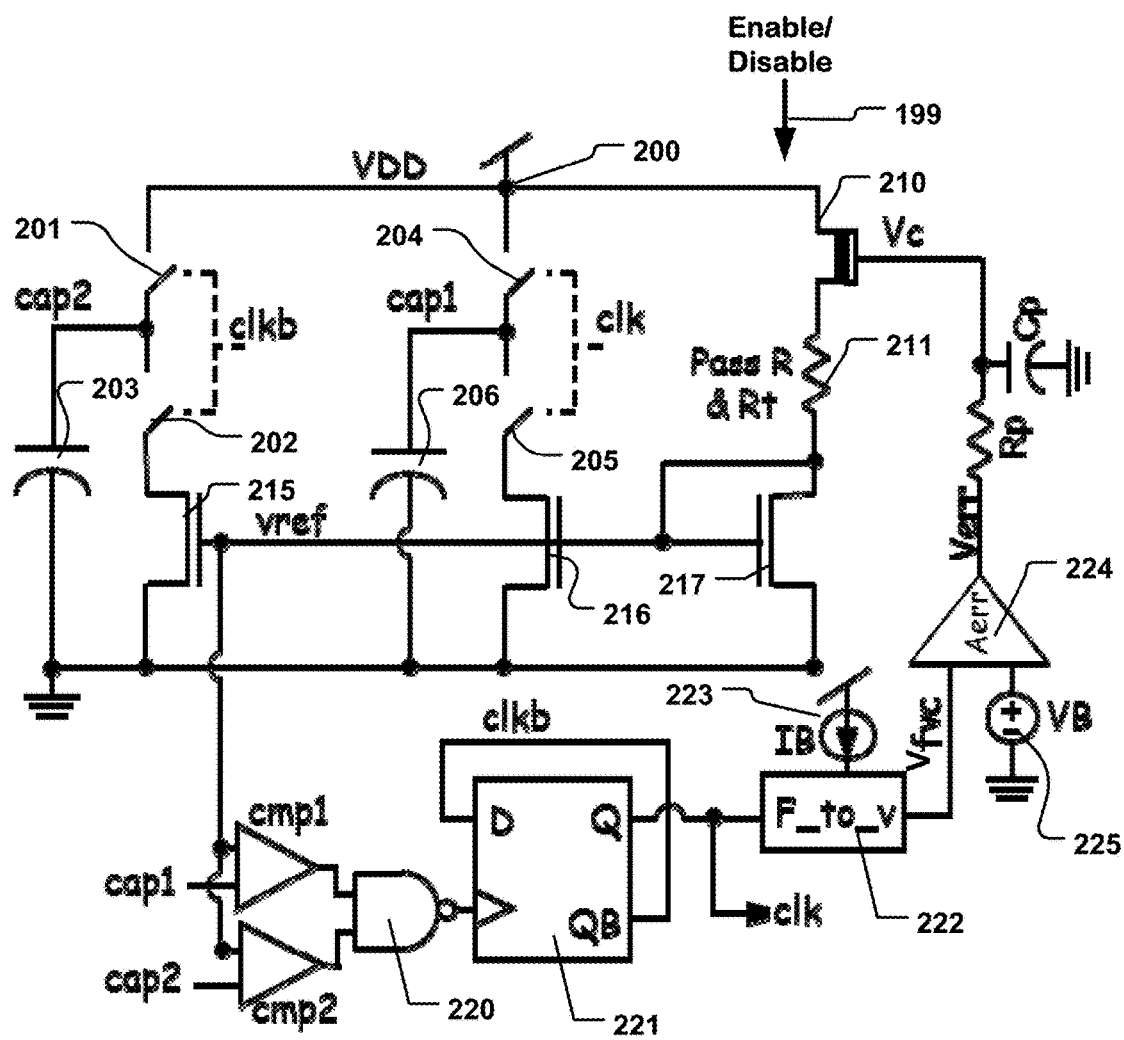
FIG. 3 is a schematic diagram of an RC relaxation oscillator with a voltage-controlled resistor in combination with a tunable resistor or other tunable element having an adjustable resistance, and including a feedback loop with an adjustable reference voltage.

FIG. 3 is a schematic diagram illustrating an RC relaxation oscillator using a combination of a voltage-controlled resistor and a tunable element having an adjustable resistance, where the voltage-controlled resistor is adjusted using a feedback loop that includes a frequency-to-voltage converter, and a loop amplifier that can comprise a calibrated error amplifier and a low pass filter. The oscillator in FIG. 3 includes a resistance/capacitance network like FIG. 2, but in which the tunable element is replaced by the combination of a voltage-controlled resistor implemented in this example using a depletion mode NMOS transistor 210 and a resistor symbol 211 that includes a combination of a small passive resistor Pass R, and a tunable resistor $R_t$. Thus, the circuit of FIG. 3 includes a voltage-controlled RC network, in which the RC time constant can be adjusted during operation, using active feedback for the control voltage $V_c$ in preferred examples. The circuit described herein can be configured target clock period of 30 ns (or 33 MHz) which is composed from Rtot=VCR+Pass_R=40K Ohm with C=375 fF (30 ns=2×40K×375f). As technology shrinks further, the values of the capacitance C can reach 10-times smaller, while Rtot could be about the same. Thus the circuit design scales readily to frequencies as high as 330 MHz (3 ns=2×40K× 37.5f) as the capacitance is reduced. By scaling the resistance by a factor of 7 or so, frequencies on the order to 2 GHz are achievable. For lower frequencies, Rtot could be increased solely by enlarging Pass_R or both VCR and Pass_R. In additional, the on-chip C might reach 10 pF range. As a result, a reasonable lower bound is close to 0.5 MHz (2000 ns=2×100K×10 pF) for implementations such as shown in FIG. 3.

As illustrated, $V_{DD}$ supply terminal 200 is used to charge capacitors 203, 206 under the control of the switch combinations 201/202 and 204/205 which are alternately opened and closed in the manner described with reference to FIG. 2 using complementary clock signals clk, clkb. The voltage-controlled resistor (depletion mode NMOS transistor 210 and passive resistor) in combination with the tunable resistor $R_t$ are connected in series with a transistor 217 to ground. The gate of the transistor 217 is connected to its drain, forming a diode connection, and establishing a voltage on its gate suitable for current mirror reference. Transistors 215 and 216 arranged in current mirror fashion with the transistor 217, are connected as current sources to the switch combinations 201/202 and 204/205, respectively. In this manner, the voltage-controlled resistor (depletion mode NMOS transistor 210 and passive resistor) in combination with the tunable resistor $R_t$ can control the RC time constant of the oscillator over a tuning range around values needed to establish a target frequency. The voltages cap1 and cap2 on the capacitor 206 and capacitor 203 are connected to the inputs of respective comparators cmp1 and cmp2. Reference voltage $V_{REF}$ which is produced at the gate of transistor 217 is used as a reference voltage for the comparators cmp1 and cmp2 in this example. Alternatively, the $V_{REF}$ circuitry of FIG. 2 can be used. The outputs of the comparators cmp1 and cmp2 are connected to the inputs of a NAND gate 220. The output of the NAND gate 220 is connected to the clock input of a D-type flip-flop 221, having its inverted output QB connected in feedback to its data input D. The true output Q of the flip-flop 221 provides the output clock clk, which is used by combinatorial logic or other circuitry not shown to produce the signals clk, clkb that control the switch combinations, and provide the output of the oscillator.

The feedback network includes a frequency-to-voltage converter 222 which operates using a stabilized reference current IB produced by the current source 223. A frequency-to-voltage converter is a circuit component that can be implemented using a variety of known models. See for example, Sato et al. cited above, and Bui et al., "*Design of a High-Speed Differential Frequency-to-Voltage Converter and Its Application in a 5-GHz Frequency-Locked Loop,*"

IEEE Transactions on Circuits and Systems—I: Regular Papers, Vol. 55, No. 3, April 2008, pp. 766-774. The stabilized reference current IB can be temperature independent, and produced using a variety of well-known current source technologies, including current sources that are stabilized using bandgap reference voltages and the like The output $V_{fvc}$ of the frequency-to-voltage converter 222 is supplied to a differential amplifier 224 having a gain $A_{err}$. A stabilized reference voltage VB produced by voltage source 225 is connected to the second input of the differential amplifier 224. The voltage source 225 can be implemented using a bandgap voltage reference or other temperature and supply independent voltage generators. The output of the differential amplifier 224 provides an error voltage $V_{err}$ that is coupled to a low pass filter, represented by the resistor $R_p$ and the capacitor $C_p$ in this example. The output of the low pass filter is the voltage $V_c$ which is applied to the voltage-controlled resistor, in this case the gate of the depletion mode NMOS transistor 210.

The oscillator circuit shown in FIG. 3 is one example of an RC relaxation oscillator implemented according to the present invention.

One aspect of the circuit shown in FIG. 3 is the voltage-controlled resistor. FIG. 4 illustrates one embodiment of a voltage-controlled resistor suitable for some embodiments, comprising an enhancement mode MOS transistor operated in the linear region, which produces a variable resistance in response to a voltage VG on its gate. For an enhancement mode device, the channel resistance $R_{ch}$ can be defined by following equation:

$$R_{ch}=1/[(\mu_n C_{ox})*(W/L)*(V_{GS}-V_{th})]$$

$\mu_n$ is mobility.
$C_{ox}$ is the gate capacitance.
W is the channel width.
L is the channel length.
$V_{GS}$ is the data source voltage.
$V_{th}$ is the threshold voltage.

However, an enhancement mode transistor can suffer process and temperature skew due to variations in threshold voltage $V_{th}$ and $\mu_n C_{ox}$. For example, for a fast testing transistor at −40° C. and slow testing transistor at 125° C., though the change in threshold voltage $\Delta V_{th}$ may be only 67 millivolts, the factor $\mu_n C_{ox}$ shrinks 2.72 times. Hence, to maintain a similar $R_{ch}$ for these process and temperature variations, the required tuning range of $V_{GS}$ is relatively large. Simulations suggest that in some embodiments the required $V_{GS}$ for operation of an enhancement mode transistor in this setting may be as high as 5.6 V. This may be impractical for some low-voltage applications.

Figure 5:
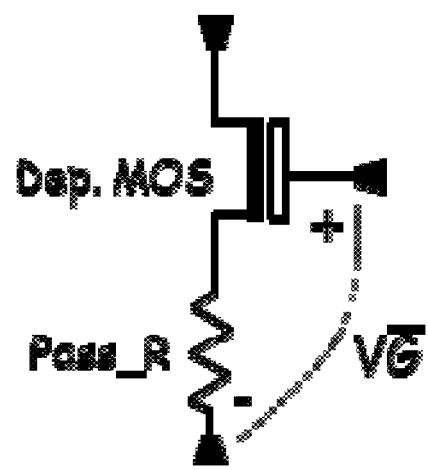
FIG. 5 illustrates a depletion mode NMOS transistor which can be used as a voltage-controlled resistor.

As described herein, it is preferable to use a depletion mode NMOS transistor with a passive resistor connected at its source side. This is illustrated in FIG. 5, and shown as the embodiment of FIG. 3.

In a depletion-mode NMOS, the threshold voltage $V_{th}$ in the nonlinear region can be negative. Also, the effects of drift in threshold voltage $V_{th}$ and mobility $\mu_n$ are lowered because the source voltage inversely tracks the changes. For example, given a fixed gate voltage VG, the channel resistance $R_{ch}$ at low temperature might get smaller as the mobility increases. However, the higher channel current would result in lifting the source voltage because of larger voltage drop across the passive resistor. This shrinks the effective $V_{GS}$, and compensates for the change in mobility. Simulations suggest that the voltage range required for tuning a depletion mode NMOS in this setting can be on the order of 1.1 V, which is much smaller than that of an enhancement mode NMOS similarly configured. Also, the circuit can be configured so that the gate voltage of 0 V could be used as the "fixed" voltage to bias the voltage-controlled resistor during trimming and calibration modes as discussed below.

The feedback loop in the clock circuit of FIG. 3 includes an error amplifier 224 and a low pass filter. The error amplifier 224 preferably has a constant gain $A_{err}$ over a bandwidth sufficient to track the changes in the output $V_{fvc}$ of the frequency-to-voltage converter 222.

FIGS. 6A, 6B, 6C illustrate an alternative configuration for a feedback loop of an RC relaxation oscillator like that of FIG. 3. In this alternative configuration, the sequence of the error amplifier and filter is changed, so that the filter occurs first in the loop. A filter stage of the loop is illustrated in FIG. 6A. It includes differential amplifier 300 having the reference voltage $V_B$ applied to its positive input. The output $V_{fvc}$ of the frequency-to-voltage converter is applied through the series combination of resistor $R_p$ and capacitor $C_p$ to the negative input of the amplifier 300. Feedback from the output of the amplifier 300 is provided through the series combination of the capacitor $C_z$ and the resistor $R_z$. An output voltage $V_f$ is produced at the output of the filter stage amplifier 300. This stage of the loop can be modeled using a transfer function as illustrated in FIG. 6A, and basically operates by subtracting $V_{fvc}$ from $V_B$, and filtering the result using the low pass configured amplifier.

The error amplifier stage of the loop is illustrated in FIG. 6B. It includes the differential amplifier having the output of the filter stage applied to the negative input, and a reference voltage provided to the positive input. Thus, a reference voltage is produced by the circuit illustrated in the figure including the voltage supply providing $V_B$, coupled to the series combination of resistors R3 and R4. The reference voltage produced at the node between the resistors R3 and R4 is applied to the positive input of the differential amplifier 301. Thus, the reference voltage in this stage is provided by dividing the voltage $V_B$ using a resistance network. The output $V_f$ of the filter stage is applied through a resistor R1 to the negative input of the differential amplifier 301. The feedback resistor R2 connects the output of the differential amplifier 301, to its negative input. The control voltage $V_c$ for the feedback loop is produced at the output of the differential amplifier 301.

In some embodiments, the ratio R1/R2 is equal to the ratio R3/R4. This can reduce or avoid a need to adjust the static level of $V_{fvc}$.

The error amplifier stage shown in FIG. 6B can be modeled by the transfer function provided in the figure.

FIG. 6C illustrates a combination of the filter stage and the error amplifier stages of FIGS. 6A and 6B, which can be used as the feedback loop in an RC relaxation oscillator described herein. The combination can share a single temperature compensated power supply providing the voltage $V_B$.

As illustrated, in the combined circuit the output $V_{fvc}$ of the frequency-to-voltage converter is applied through the series combination of the resistor $R_p$ and the capacitor $C_p$ to the negative input of the first amplifier 300. The output of the first amplifier 300 is connected through a feedback path including the series combination of the capacitor $C_z$ and the resistor $R_z$ to the negative input. Positive input of the amplifier 300 is coupled to the reference supply providing voltage $V_B$. The output $V_f$ of the first stage is applied through the resistor R1 to the negative input of the amplifier 301. The output of the amplifier 301 is connected through a feedback path including resistor R2 to its negative input. The positive input of the amplifier 301 receives a reference voltage produced at the node between resistors R3 and R4, which are connected between the reference supply providing voltage VB and ground.

This embodiment of the feedback loop can be stable over variations in temperature and process, because its output depends largely on the magnitudes of passive components including resistors and capacitors. Also, because the output $V_{fvc}$ of the frequency-to-voltage converter is first filtered before being applied to the error amplifier, bandwidth requirement for unity gain performance of the error amplifier is reduced.

The feedback circuit shown in FIG. 6C can be modeled by the transfer function provided in the figure.

In the feedback network shown in FIG. 6C, the voltage $V_f$ at the output of amplifier 300 is initially slightly higher than the voltage at the negative input (labeled $F_n$). This occurs because of a small charging current flowing through the resistor $R_z$ and capacitor $C_z$ in the feedback link. In addition, in an embodiment in which the ratio R1/R2 is equal to the ratio R3/R4, and by contrast voltage theory, the initial voltage at the negative input of the amplifier 301 has slightly higher magnitude than the voltage at the positive input. In this case, the control voltage $V_c$ will be close to $V_{SS}$. As a result, the voltage produced by the voltage-controlled resistor in the feedback loop will be set at its minimum during this initial interval, causing the oscillator clock to be set at its minimum as well. These initial conditions are temperature independent based on simulations.

Another advantage from the circuit of FIG. 6C arises because loop gain adjustment is flexible. In a conventional feedback network, the gain of the lead-lag loop filter will be close to unity. This causes the total loop gain to be defined by the gain of the frequency-to-voltage converter, the ratio of the change in clock rate and the change in gate voltage of the voltage-controlled resistor, and a gain of the error amplifier. This configuration of the conventional system limits the choices that can be made in implementing the circuit.

In the embodiment described herein, that DC gain of the loop filter is based on the ratio of $C_p/C_z$ in the filter stage of the feedback, and not unity. Thus, the total filter capacitor size can be optimized by modifying the gain of the filter stage in the gain of the error stage to achieve similar settling time and ringing properties. Thus, the total capacitor size that can be used in circuits as described herein can be reduced.

Figures 7A, 7B, 7C:
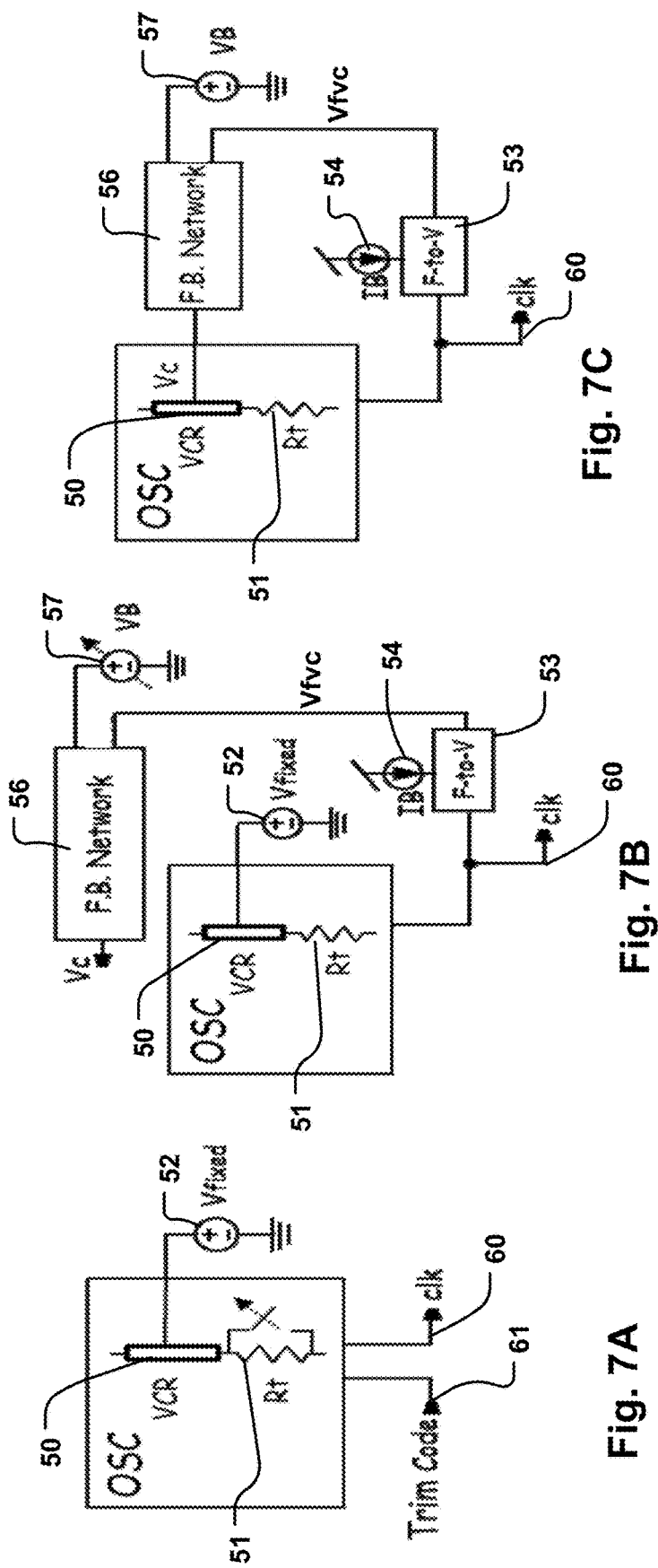
FIGS. 7A-7C are heuristic diagrams used for description of the steps of trimming the tunable element, adjusting the adjustable reference voltage, and setting the circuit for normal operation.

FIGS. 7A, 7B and 7C are heuristic diagrams explaining features of the oscillator described herein. One feature is that it includes the voltage-controlled resistor combined with the tunable resistor which can be tuned in the configuration described with reference to FIG. 7A. Another feature is the reference voltage used in the feedback circuit can be calibrated in the configuration described with reference to FIG. 7B. Another feature illustrated in these figures is the closed loop operation as described with reference to FIG. 7C.

As shown in FIG. 7A, the oscillator includes the combination of the voltage-controlled resistor 50 and a tunable resistor 51. An output clock clk is produced that is a function of the resistance produced by this combination. The resistance of the tunable resistor 51 is static during operation in this embodiment, and is determined by a trim code (e.g. the first static parameter) which is provided as input on line 61. The trim code (e.g. the first static parameter) for the tunable resistor $R_t$ can be set during a manufacturing step, and stored in nonvolatile memory on the chip with the oscillator. The nonvolatile memory can be implemented using fuse circuits, floating gate memory cells, charge trapping memory cells, or other storage technologies deployed for parameter storage on integrated circuits. The tunable resistor can be implemented using a variety of tunable elements having an adjustable resistance, including the use of a network of passive resistors with a set of switches that are used to connect and disconnect the resistors in various combinations, and the use of MOS transistors biased for adjustable resistance operation. The switches are controlled by the nonvolatile memory storing the trim code (e.g. the first static parameter), either directly or using combinatorial logic.

During manufacturing or another time before normal operation of the device, a trimming step is executed, in which a fixed voltage 52 is applied to the voltage-controlled resistor 50.

As mentioned above, if the voltage-controlled resistor is a depletion mode NMOS, this fixed voltage 52 can be ground in some configurations. The output clock on line 60 is connected to a test system, which adjusts the trim code until the output clock matches a preferred reference clock frequency. The fixed voltage 52 can be provided using an on-chip circuit, or alternatively also provided by the test system. The trim code is static and, as a result, the resistance of the tunable resistor $R_t$ is static during operation of the oscillator, where the term "static" as used herein means that it is not actively changed during operation of the oscillator.

As shown in FIG. 7B, the circuit is configured as shown for calibration of the reference voltage used in the feedback circuit.

In the illustrated configuration, the clock on line 60 is applied to the frequency-to-voltage converter 53, which outputs the frequency-to-voltage converter value $V_{fvc}$. The $V_{fvc}$ value is applied to the feedback network 56, which also receives a reference voltage produced by the tunable voltage source 57. The reference voltage $V_B$ provided by the voltage source 57 is tunable during the calibration stage by a test system while the constant voltage $V_{fixed}$ is applied to the voltage-controlled resistor, and the value of the tunable resistor 51 is held static as set by the trim code. The calibration process sets the reference voltage so that $V_{fvc}$ is equal to the tuned output of the source providing voltage $V_B$ in this configuration, or so that it otherwise matches $V_{fvc}$ in order to produce a calibrated reference voltage $V_B$ that results in the target frequency.

FIG. 7C heuristically illustrates the normal operating mode, where the control voltage $V_c$ is connected to the voltage-controlled resistor, the tunable resistor 51 has been trimmed, and the reference voltage $V_B$ provided by the source 57 has been calibrated.

The current $I_B$ used to drive the frequency-to-voltage converter 53 and the voltage $V_B$ produced by the source 57 used to provide the reference voltage for the feedback network 56 are temperature independent over the range of temperatures specified for operation of the device. Current $I_B$ and voltage $V_B$ can be produced using, for example, bandgap reference circuits, or other known circuits, such as using combinations proportional to the absolute temperature PTAT and complementary to absolute temperature CTAT current and voltage sources. While current $I_B$ and voltage $V_B$ are essentially temperature independent, their values might drift due to process variations that occur in the manufacturing of the circuit. See for example, Lee et al., "*A 1.4uW 24.9ppmC Current Reference With Process Insensitive Temperature Compensation in 0.18um CMOS,*" IEEE Journal of Solid State Circuits, Vol. 47, No. 10, October. 2012, pp. 2527-2533. The output of frequency-to-voltage converter, or $V_{fvc}$, is proportional to the value of current $I_B$. To compensate for drift of the current $I_B$, the current source providing current $I_B$ value can be calibrated by tuning $V_B$ so that it is equal to $V_{fvc}$ at the calibration stage in FIG. 7B. Also, the same ability to calibrate for process variations holds for the case if voltage $V_B$ drifts. Therefore, the operating flow shown in FIGS. 7A, 7B and 7C are tolerant to drifts in value of current $I_B$ and voltage $V_B$, and to process variations in the manufacturing of the current and voltage sources.

Figure 8:
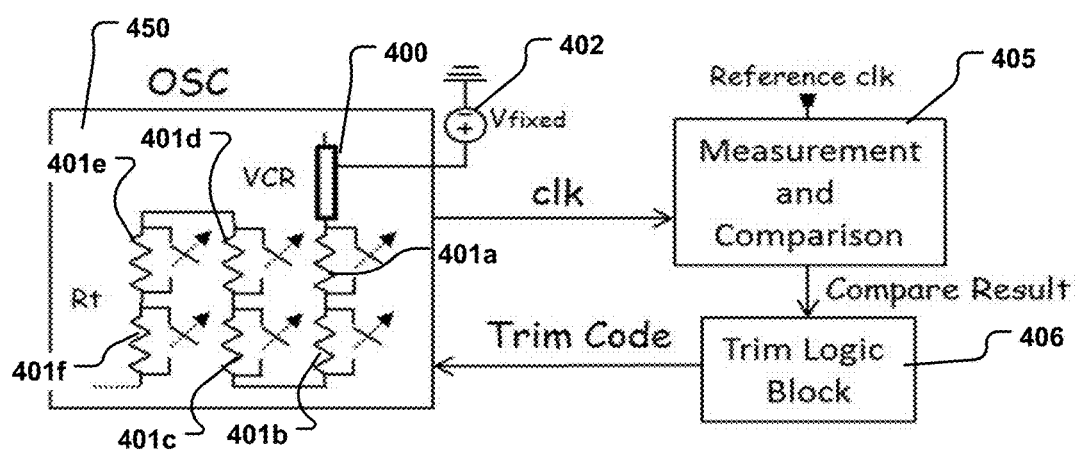
FIG. 8 is a more detailed diagram of a tunable element and supporting technology for setting a trim code (e.g. the first static parameter) for the tunable element.

FIG. 8 is a more detailed illustration of a configuration like that shown in FIG. 7A, used for setting the trim code that determines the value of the tunable resistor $R_t$ in the resistance/capacitance network for an RC relaxation oscillator 450. As with FIG. 7A, the oscillator 450 is set up to provide an oscillator output signal clk with a fixed voltage $V_{fixed}$ provided by a reference source 402 on the voltage-controlled resistor 400. The tunable element having an adjustable resistance comprises a set of series connected resistor/switch circuits 401a to 401f. The switches are controlled by the trim code, and are used to select a combination of passive resistors for connection in series set to a static value $R_t$. In order to set the trim code, oscillator output signal clk is provided to a test system including a module 405 for measurement and comparison of the oscillator output signal clk with a reference clock. The result of the comparison is provided to a trim logic block 406, which manipulates the trim code using a binary search algorithm or other search strategies, until the oscillator output signal clk matches the reference clock. The tunable element in FIG. 8 is a simplified version including six series resistors/switch circuits. A variety of configurations can be used that include combinations of series and parallel resistors. In preferred embodiments, passive devices are used provide a resistance to reduce temperature and process variations. In other embodiments, active devices can be used with appropriate temperature and process compensation. Also, combinations of active components (e.g. diodes, transistors) and passive components can be used.

Figure 9:
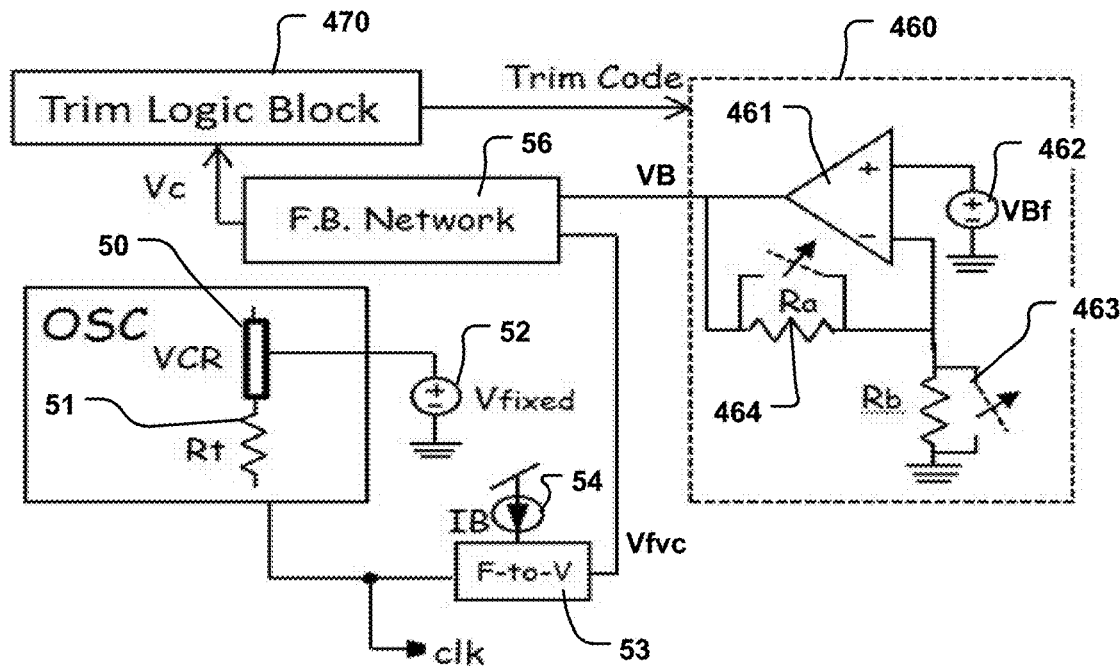
FIG. 9 is a more detailed diagram of an adjustable reference circuit and supporting technology for setting a trim code (e.g. the first static parameter) for the adjustable reference circuit.

FIG. 9 is a more detailed illustration of a configuration like that shown in FIG. 7B, used for calibrating the reference voltage $V_B$ in the feedback loop. The components that are described with reference to FIG. 7B are given like reference numbers and not described again. In FIG. 9, the reference voltage circuit represented by the source 57 in FIG. 7B is implemented using by the tunable circuit 460. The tunable circuit 460 includes a differential amplifier 461 which receives a stable reference voltage $V_{Bf}$ from source 462 at its positive input, and has a tunable resistance network including tunable resistor 464 and tunable resistor 463 coupled to its negative input. The tunable resistor 464 is connected from the output of the amplifier 461 to the negative input. The tunable resistor 463 is connected from the negative input to ground. The tunable resistors 463, 464 can be implemented in a manner discussed above for the tunable resistor used in the circuit described with reference to FIG. 8. The tunable resistors 463, 464 are used to adjust the gain of the tunable circuit 460 so as to provide a calibrated, stable reference voltage $V_B$ on its output. In order to set the gain of the tunable circuit 460, the reference voltage $V_B$ is applied to the feedback network 56 of the oscillator, examples of which are shown in FIG. 6C and in FIG. 10, for measurement and comparison of the output signal $V_B$ with the frequency-to-voltage converter voltage $V_{fvc}$. The output of the feedback network is the control voltage $V_c$, which is applied in the calibration mode to a trim logic block 470 in a test system. The trim logic block 470 can use a binary search algorithm or other search strategies, to determine the trim code values needed to set the resistances $R_a$ and $R_b$ of the tunable resistors 463, 464 which can cause the tunable circuit 460 to produce a stabilized reference voltage $V_B$ equal to the frequency-to-voltage converter voltage $V_{fvc}$. The trim code for calibrating the reference voltage $V_B$ can be set during a manufacturing step, and stored as a second static parameter in nonvolatile memory on the chip with the oscillator. The nonvolatile memory can be implemented using fuse circuits, floating gate memory cells, charge trapping memory cells, or other storage technologies deployed for parameter storage on integrated circuits.

Figure 10:
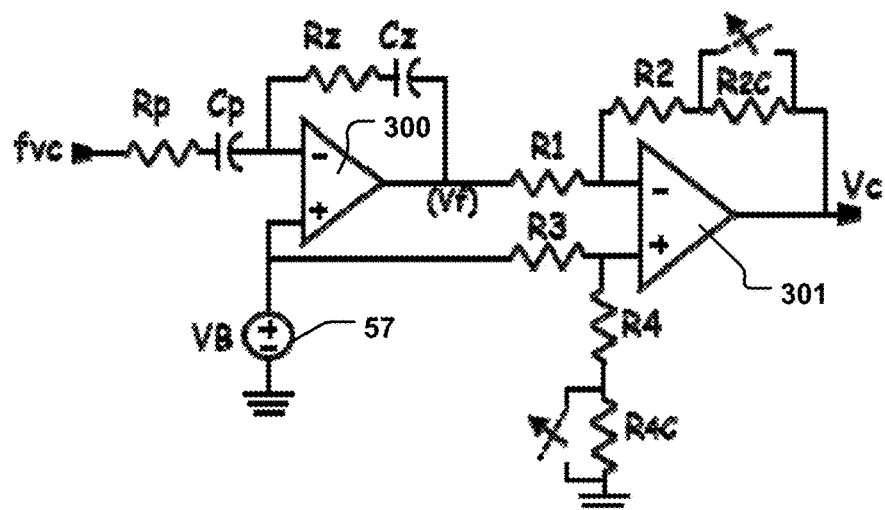
FIG. 10 illustrates a feedback circuit having an adjustable gain.
Figures 11A, 11B, 11C:
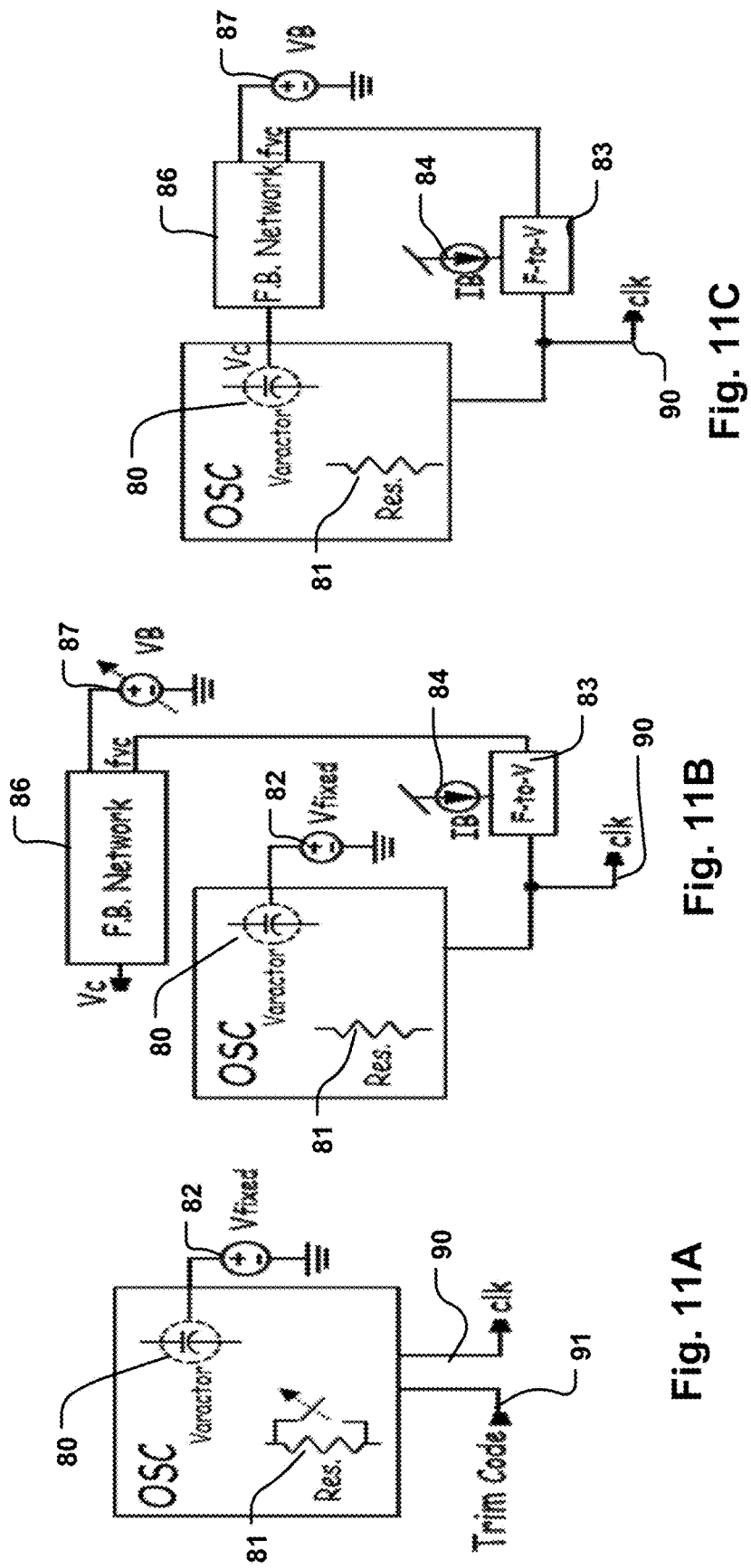
FIGS. 11A-11C are heuristic diagrams illustrating an embodiment in which the RC network includes a voltage-controlled capacitor, showing the steps of trimming the tunable element, adjusting the adjustable reference voltage, and setting the circuit for normal operation.

FIG. 10 is an alternative embodiment of a feedback network like that of FIG. 6C, which has a normal operating mode and a calibration mode. In the embodiment shown in FIG. 10, reference numbers used in common elements of FIG. 6C are used again, and those components are not described here. In this example, the switchable resistor R2C and the switchable resistor R4C are added to the resistance network on amplifier 301 as illustrated. The switchable resistors comprise a resistor in parallel with a switch. During the calibration mode, the switch is open inserting the resistance in series and increasing the gain of the error amplifier stage in the feedback loop. The switch can be operated using the test equipment that performs calibration operations, or by logic on the chip with the oscillator that is responsive to entry of a calibration mode. During the normal operating mode, the gain of the feedback loop needs to be designed to ensure loop stability, settling time and to control transient ringing. During calibration mode, however, the gain can be increased so that small differences between the output of the frequency-to-voltage converter and the reference voltage $V_B$ can drive the output $V_c$ to logic-1 or logic-0 levels. For example, logic-1 can be produced for $V_B$ higher than $V_{fvc}$ and logic-0 can be produced for $V_B$ lower than $V_{fvc}$. With this measurement and comparison result carried by Vc, the gain of the tunable circuit 460 could be set by manipulating the trim code using a binary search algorithm or other search strategies from logic block 470. The embodiments of the RC relaxation oscillator described with reference to FIGS. 1-10 comprise voltage-controlled RC networks that use static capacitors with adjustable resistors. FIGS. 11A, 11B, and 11C illustrate the resistance trimming, reference voltage calibration, and normal operating mode stages of an RC relaxation oscillator that comprises a voltage-controlled RC network which operates based on adjustable capacitors. In this example, the adjustable capacitors are implemented using varactors. A varactor can be implemented for example using a variable capacitance diode, variable reactance diode or tuning diode or other type of diode designed to exploit the voltage-dependent capacitance of a reversed-biased p-n junction.

FIGS. 11A, 11B and 11C are heuristic diagrams explaining features of the RC relaxation oscillator described herein. One feature includes the voltage-controlled capacitor combined with the tunable resistor in the RC network which can be tuned in the configuration described with reference to FIG. 11A. Another feature is the reference voltage used in the feedback network which can be calibrated in the configuration described with reference to FIG. 11B. Another feature illustrated in these figures is the closed loop operation as described with reference to FIG. 11C.

As shown in FIG. 11A, the oscillator includes an RC network comprising the combination of a voltage-controlled capacitor 80 and a tunable resistor 81. An output clock clk is produced that is a function of the capacitance and resistance produced by this combination. The resistance of the tunable resistor 81 is static during operation in this embodiment, and is determined by a trim code which is provided as input on line 91. The trim code for the tunable resistor 81 can be set during a manufacturing step, and stored in nonvolatile memory on the chip with the oscillator. The tunable resistor can be implemented in a variety of ways, including the use of a network of passive resistors with a set of switches that are used to connect and disconnect the resistors in various combinations. The switches are controlled by the nonvolatile memory storing the trim code, either directly or using combinatorial logic. During manufacturing, a trimming step is executed, in which a fixed voltage 82 is applied to the voltage-controlled capacitor 80. As mentioned above, the voltage-controlled capacitor can be implemented using a varactor, for example. The output clock on line 90 is connected to a test system, which adjusts the trim code until the output clock matches a preferred reference clock frequency. The fixed voltage 82 can be provided using an on-chip circuit, or alternatively also be provided by the test system.

As shown in FIG. 11B, the circuit is configured as shown for calibration of the reference voltage used in the feedback loop.

In the illustrated configuration, the clock on line 90 is applied to the frequency-to-voltage converter 83, which outputs the frequency-to-voltage converter value $V_{fvc}$. The $V_{fvc}$ value is applied to the feedback network 86, which also receives a reference voltage $V_B$ produced by the tunable voltage source 87. The reference voltage $V_B$ provided by the voltage source 87 is tunable during calibration stage by a test system while the constant voltage $V_{fixed}$ is applied to the voltage-controlled capacitor 80 and the value of the tunable resistor 81 is held static as set by the trim code. The calibration process sets the reference voltage so that $V_{fvc}$ is equal to the tuned output of the source providing $V_B$ whereby the output clock on line 90 is maintained at the target frequency.

FIG. 11C heuristically illustrates the normal operating mode, where the control voltage $V_c$ is connected to the voltage-controlled capacitor, the tunable resistor 81 has been trimmed, and the reference voltage $V_B$ provided by the source 87 has been calibrated.

Figure 12:
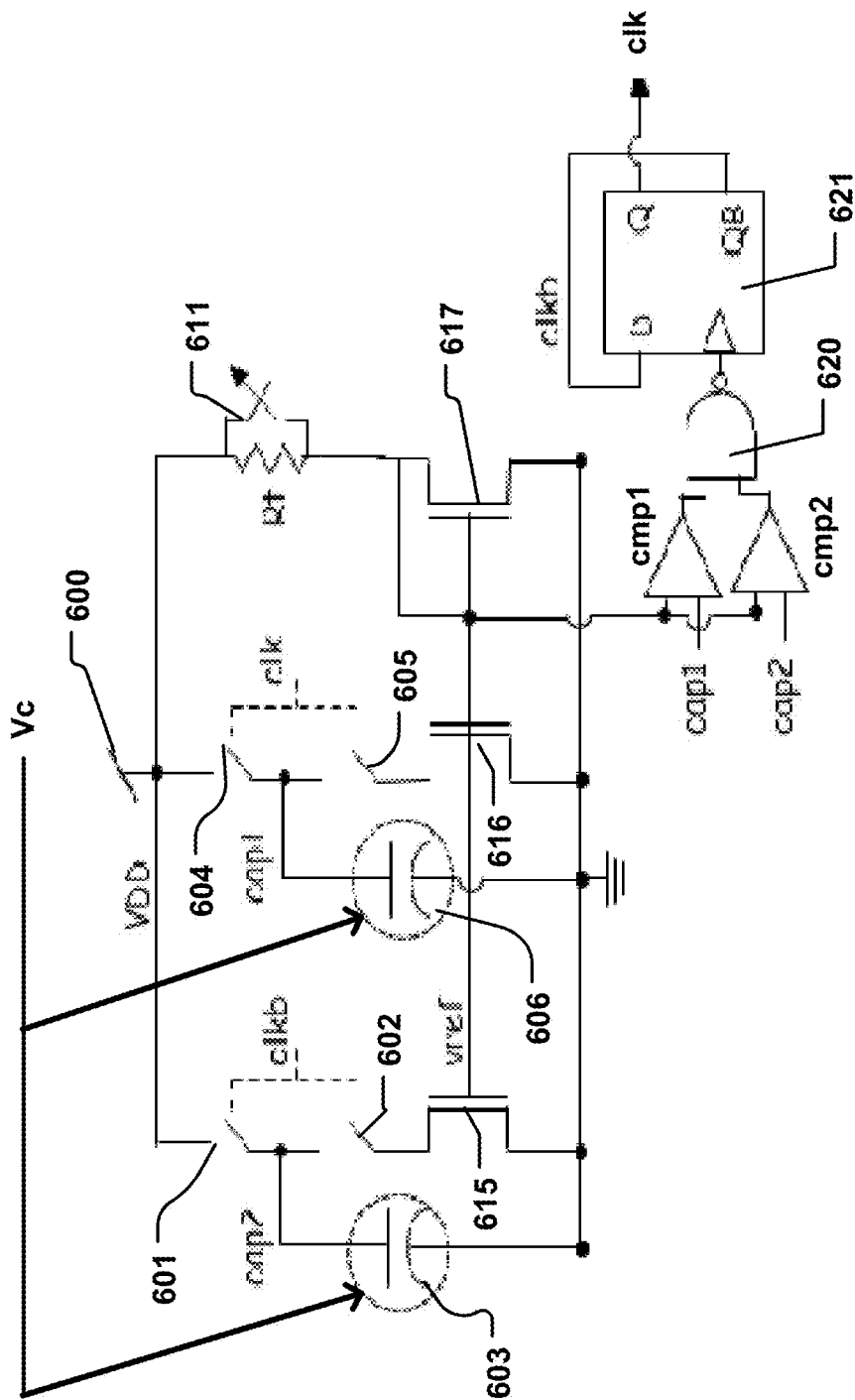
FIG. 12 is schematic diagram of an RC relaxation oscillator in which the RC network includes a varactor used as a voltage-controlled capacitor.

FIG. 12 is a schematic diagram of an RC relaxation oscillator which can be utilized in a system like that of FIGS. 11A to 11C.

FIG. 12 is a schematic diagram illustrating an RC relaxation oscillator using a voltage-controlled RC network that comprises a combination of a voltage-controlled capacitor and a tunable resistor, where the voltage-controlled capacitor can be adjusted using a feedback circuit that includes a frequency-to-voltage converter, an error amplifier and a low pass filter as described above. The oscillator in FIG. 12 includes a resistance/capacitance network like FIG. 2, but in which the capacitors are replaced by the voltage-controlled capacitors implemented in this example using varactors. Thus, the circuit of FIG. 12 includes a voltage-controlled RC network, in which the RC time constant can be adjusted during operation, using active feedback for in preferred examples, by the control voltage $V_c$.

As illustrated, $V_{DD}$ supply terminal 600 is used to charge varactors 603, 606 under the control of the switch combinations 601/602 and 604/605 which are alternately opened and closed in the manner described with reference to FIG. 2 using complementary clock signals clk, clkb. The tunable resistor $R_t$ is connected in series with a transistor 617 to ground. The gate of the transistor 617 is connected to its drain forming a diode connection, and establishing a voltage on its gate suitable for current mirror reference. Transistors 615 and 616, arranged in current mirror fashion with the transistor 617, are connected as current sources to the switch combinations 601/602 and 604/605, respectively. In this manner, the voltage-controlled varactors in combination with the tunable resistor $R_t$ can control the RC time constant of the oscillator. The voltages cap1 and cap2 on the varactor 606 and varactor 603 are connected to the inputs of respective comparators cmp1 and cmp2. Reference voltage $V_{REF}$ which is produced at the gate of transistor 617 is used as a reference voltage for the comparators cmp1 and cmp2 in this example. The outputs of the comparators cmp1 and cmp2 are connected to the inputs of a NAND gate 620. The output of the NAND gate 620 is connected to the clock input of a D-type flip-flop 621, having its inverted output QB connected in feedback to its data input D. The true output Q of the flip-flop 621 provides the output clock clk, which is used by combinatorial logic or other circuitry not shown to produce the signals clk, clkb that control the switch combinations, and provide the output of the oscillator.

Figure 13:
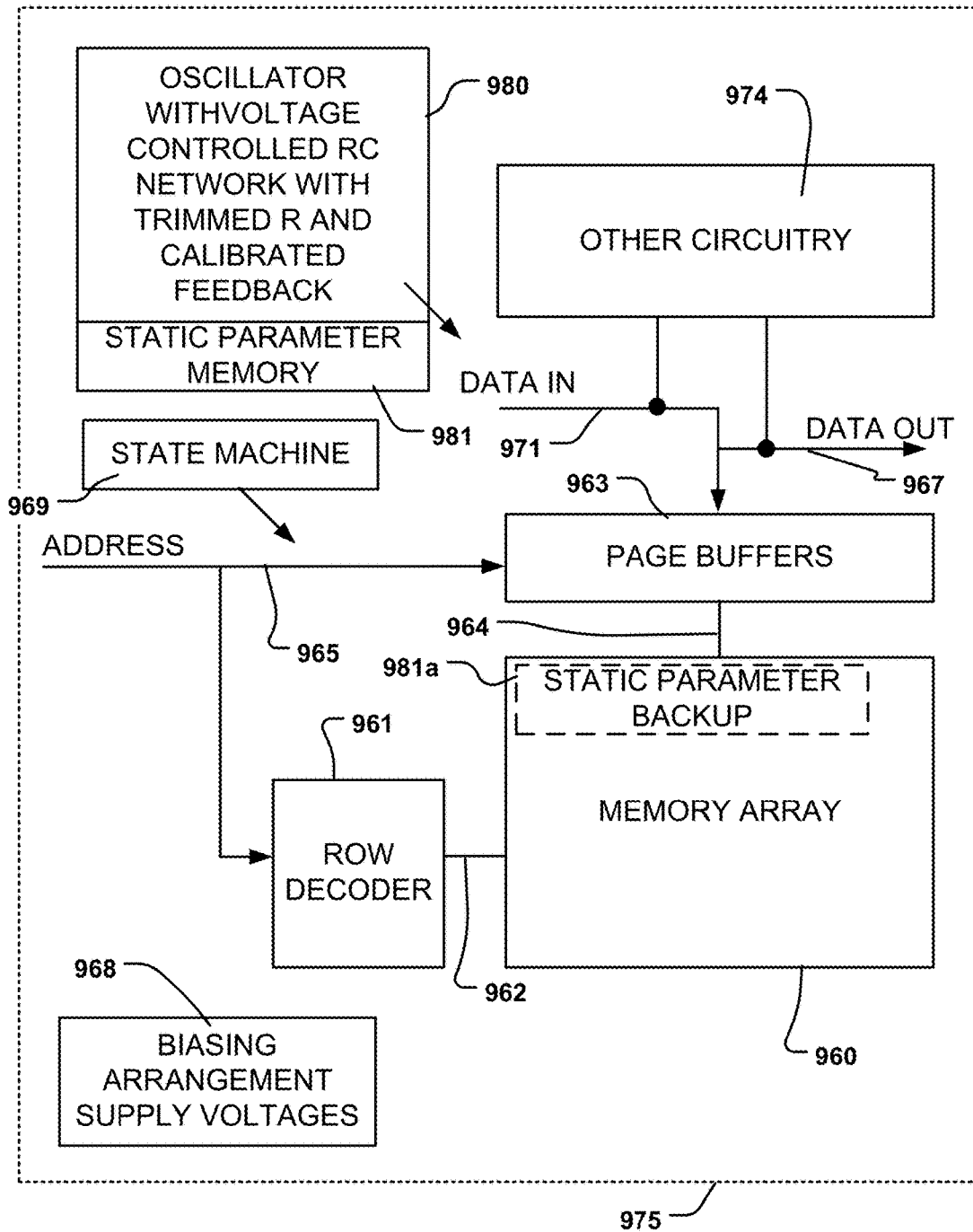
FIG. 13 is a block diagram of an integrated circuit including oscillator with a voltage-controlled RC network with a trimmed resistor and calibrated feedback, as described herein.

FIG. 13 is a simplified chip block diagram of an integrated circuit 975 including an oscillator 980 (such as an RC relaxation oscillator) using a voltage-controlled RC network, having a trimmed resistor and calibrated feedback. This example integrated circuit 975 includes a memory array 960 on an integrated circuit substrate with the oscillator 980. A nonvolatile static parameter memory 981 on the chip stores the static parameters as described above. The static parameter memory 981 can also be implemented as part of the array 960 in other embodiments. In some embodiments, backup copies, including two or several copies of the first and second static parameters, can be encoded and stored within different blocks (e.g. 981a, 981b) or the same blocks of the same nonvolatile memory to protect the first and second static parameters. In case that one copy has failed bits and other copies could still be utilized. In some embodiments, the oscillator has a disabled status which can be set by a control signal, as described with reference to signal 199 in FIG. 3. In the disabled status, the output signal is not oscillating and the internal signals can be set at zero or at an internal regulated voltage level. The power consumption of a disabled oscillator can be relatively small compared with an enabled oscillator.

In the illustrated memory chip, a row decoder 961 is coupled to a plurality of word lines 962, and arranged along rows in the memory array 960. A page buffer 963 in this example is coupled to a plurality of bit lines 964 arranged along columns in the memory array 960 for reading data from and writing data to the memory array 960. Addresses are supplied on bus 965 to page buffer 963 and row decoder 961. The page buffers 963 are coupled to data-in circuits and data-out circuits via lines 971 and 967.

Other circuitry 974 can be included on the chip to support mission functions, to provide system-on-a-chip SOC functionality and so on. Control logic 969, including a state machine, for example, or other control circuits, controls the application of supply voltages generated or provided through the voltage supply or supplies in block 968, such as read, verify and program voltages.

The control logic 974 can be implemented using special purpose logic circuitry as known in the art. In alternative embodiments, the control logic comprises a general purpose processor, which can be implemented on the same integrated circuit, which executes a computer program to control the operations of the device. In yet other embodiments, a combination of special purpose logic circuitry and a general purpose processor can be utilized for implementation of the control logic.

The oscillator output signal is utilized as a clock signal by on-chip circuitry, including one or more of control logic, all or part of the other circuitry, and the page buffers. In some embodiments, the oscillator can be an RC relaxation oscillator without the need for an off-chip reference clock. In other embodiments, the oscillator 980 can comprise a frequency locked loop, a phase locked loop or a delay locked loop.

Figure 14:
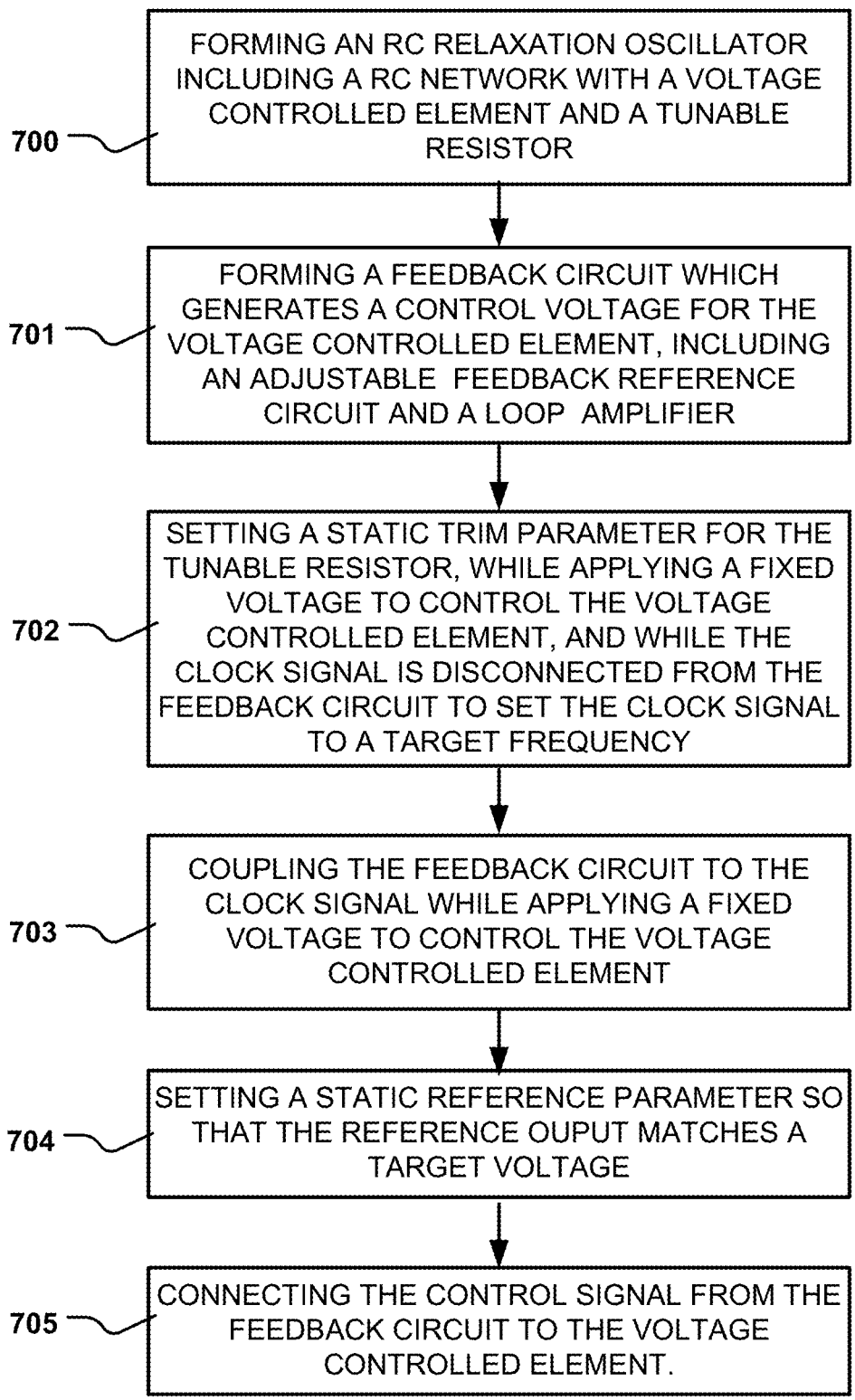
FIG. 14 is the simplified flowchart for a manufacturing process used to form an oscillator as described herein.

FIG. 14 is a simplified flowchart for a method for manufacturing a clock circuit as described herein. First, using integrated circuit design and manufacturing technologies, an RC relaxation oscillator as described above is formed on an integrated circuit substrate (700). The RC relaxation oscillator includes an RC network with a voltage-controlled element (voltage-controlled resistor or voltage-controlled capacitor) and a tunable resistor. Also, a feedback circuit as described above is formed on the integrated circuit substrate which is used to generate a control voltage for the voltage-controlled element (701). The feedback circuit includes an adjustable feedback reference circuit and a loop amplifier. The feedback circuit can include a low pass filter and an error amplifier, both of which are implemented in some embodiments using differential amplifiers with passive feedback circuits that can be stable with changes in temperature.

After forming the oscillator and the feedback circuit, the integrated circuit is coupled to a test system that is used for trimming the tunable resistor and for calibrating the adjustable feedback reference circuit. In a step for setting the first static parameter for the tunable resistor, a fixed voltage is applied to control the voltage-controlled element while the oscillator output signal is disconnected from the feedback circuit. The test system can trim the resistor so that the oscillator operates at a target frequency at the temperature of the trimming step (702). The first static parameter is stored on the integrated circuit in a nonvolatile memory that is coupled to the tunable resistor.

Next, with the tunable resistor set by the first static parameter, the feedback circuit is coupled to the oscillator output signal while applying a fixed voltage to control the voltage-controlled element (703). In this condition, a second static parameter is set by the test system so that the reference output matches a target voltage, which target voltage can be the target frequency-to-voltage converter value $V_{fvc}$, whereby the target frequency is maintained at temperature of the test (704). In some embodiments, the gain of the error amplifier in the feedback circuit can be increased during the adjustment step. The second static parameter is stored on the integrated circuit in a nonvolatile memory that is coupled to the adjustable feedback reference circuit.

After setting the first static parameter and the second static parameter, the control signal from the feedback circuit is connected to the voltage-controlled element (705). After any further testing and adjustments performed by the test system, the oscillator can operate in a normal operating mode, and the formation of the oscillator circuit is completed.

FIG. 14 is a flowchart illustrating a manufacturing method. It will be appreciated that some of the steps can be combined, performed in parallel or performed in a different sequence without affecting the functions achieved. In some cases, as the reader will appreciate, a rearrangement of steps will achieve the same results only if certain other changes are made as well. In other cases, as the reader will appreciate, a rearrangement of steps will achieve the same results only if certain conditions are satisfied. Furthermore, it will be appreciated that the flow charts herein show only some steps that are pertinent to an understanding of the invention, and it will be understood that numerous additional steps for accomplishing other functions can be performed before, after and between those shown.

For the purposes of this description, a value, such a voltage, resistance or current, can be considered to be based on a static parameter, if it is determined at least in part by a circuit responsive to the static parameter.

The technology described herein provides a circuit and a method to calibrate feedback loop parameters for an RC relaxation oscillator. The feedback loop as calibrated can compensate for drift of the RC time constant and comparator delays within the oscillator at different process and temperature corners.

The topology of a feedback network can also reduce the development time of loop filter parameters.

The feedback configuration described can also be applied to frequency locked loops FLL and like circuits, such as phase locked loops PLL or delay locked loops DLL. The system calibration method could be applied to a circuit system where a precise clock period is desired such as memory, system-on-a-chip systems, and other devices.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A clock circuit, comprising:
an oscillator that produces an oscillator output signal, the oscillator including an RC network with a voltage-controlled element, and a tunable element having an adjustable resistance based on a first static parameter; and
a feedback circuit coupled to the oscillator, which generates a control signal for the voltage-controlled element, the feedback circuit including a feedback reference circuit having a stabilized reference output, and a loop amplifier responsive to the reference output and the oscillator output signal;
wherein the RC network includes switches responsive to the oscillator output signal, to alternatively charge and discharge capacitors in the RC network, where a first node in the RC network has a voltage that is a function of charge on one of the capacitors and a second node in the RC network has a voltage that is a function of charge on another one of the capacitors; and
the oscillator includes a clock amplifier, having a signal input coupled to the first and second nodes in the RC network and an output, configured to amplify differences between the voltages on the first and second nodes and a reference, to produce the oscillator output signal.

2. The clock circuit of claim 1, including nonvolatile memory connected to the tunable element storing the first static parameter.

3. The clock circuit of claim 1, wherein the feedback reference circuit generates the stabilized reference output at a voltage level based on a second static parameter, and including nonvolatile memory connected to the feedback reference circuit storing the second static parameter.

4. The clock circuit of claim 3, including a non-volatile memory array on a same integrated circuit with the oscillator, the non-volatile memory array storing one or more backup copies of the first and second static parameters.

5. The clock circuit of claim 1, wherein:
the feedback circuit includes a frequency-to-voltage converter; and
the loop amplifier includes a low pass filter having an input coupled to the frequency-to-voltage converter and an output, and an error amplifier coupled to the output of the low pass filter and to the reference output.

6. The clock circuit of claim 5, wherein the loop amplifier includes a low pass amplifier stage and an error amplifier stage, the low pass amplifier stage comprising an amplifier and an RC feedback whereby a gain and frequency response of the low pass amplifier stage are a function of passive resistors and capacitors, and the error amplifier stage comprising an amplifier with resistive feedback whereby a gain of the error amplifier stage is a function of passive resistors.

7. The clock circuit of claim 1, wherein the loop amplifier comprises an amplifier, with positive and negative inputs, configured with a resistive feedback circuit between its output and its negative input, and a resistor divider on the positive input which in combination sets a gain during normal operation, and including a circuit that increases resistance in the resistive feedback circuit and the resistor divider in a calibration mode to increase the gain.

8. The clock circuit of claim 1, wherein the oscillator has an enabled mode and a low power mode.

9. A clock circuit, comprising:
an oscillator that produces an oscillator output signal, the oscillator including an RC network with a voltage-controlled element, and a tunable element having an adjustable resistance based on a first static parameter; and
a feedback circuit coupled to the oscillator, which generates a control signal for the voltage-controlled element, the feedback circuit including a feedback reference circuit having a stabilized reference output, and a loop amplifier responsive to the reference output and the oscillator output signal;
wherein the loop amplifier comprises an amplifier having adjustable gain, configured to increase the gain in a calibration mode.

10. A method for manufacturing a clock circuit, comprising:
forming an oscillator that produces an oscillator output signal, the oscillator including an RC network with a voltage-controlled element, and a tunable element having an adjustable resistance based on a first static parameter;
forming a feedback circuit which generates a control signal for the voltage-controlled element, the feedback circuit including an adjustable feedback reference circuit having a stabilized reference output, and a loop amplifier responsive to the reference output and the oscillator output signal;
setting the first static parameter to set the oscillator output signal to a frequency matching a target frequency while applying a fixed voltage to control the voltage-controlled element and while the feedback circuit is disconnected from the oscillator output signal;
coupling the feedback circuit to the oscillator output signal while applying a fixed voltage to control the voltage-controlled element, so that the reference output matches a target voltage; and
connecting the control signal from the feedback circuit to the voltage-controlled element.

11. The method of claim 10, including storing the first static parameter in nonvolatile memory coupled to the tunable element.

12. The method of claim 10, including setting the stabilized reference output at a voltage level based on a second static parameter, and storing the second static parameter in nonvolatile memory coupled to the to the feedback reference circuit.

13. The method of claim 12, including storing one or more backup copies of the first and second static parameters in a non-volatile memory array on a same integrated circuit with the oscillator.

14. The method of claim 10, wherein the RC network includes switches responsive to the oscillator output signal, to alternatively charge and discharge capacitors in the RC network, where a first node in the RC network has a voltage that is a function of the charge on one of the capacitors and a second node in the RC network has a voltage that is a function of another one of the capacitors; and
the oscillator includes a clock amplifier, having a signal input coupled to the first and second nodes in the RC network, and an output configured to amplify differences between the voltages on the first and second nodes and a reference, to produce the oscillator output signal.

15. The method of claim 10, wherein:
the feedback circuit includes a frequency-to-voltage converter; and
the loop amplifier includes a low pass filter having an input coupled to the frequency-to-voltage converter and an output, and an error amplifier coupled to the output of the low pass filter and to the reference output.

16. The method of claim 15, wherein the loop amplifier includes a low pass amplifier stage and an error amplifier stage, the low pass amplifier stage comprising an operational amplifier with RC feedback, and setting a gain and frequency response of the low pass amplifier stage as a function of passive resistors and capacitors, and the error amplifier stage comprising an operational amplifier with resistive feedback and setting a gain of the error amplifier stage as a function of passive resistors.

17. The method of claim 10, wherein the loop amplifier comprises an amplifier, with positive and negative inputs, configured with a resistive feedback circuit between its output and its negative input, and a resistor divider on the positive input which in combination sets a gain during normal operation, and including increasing resistance in the resistive feedback circuit and the resistor divider in a calibration mode to increase the gain.

18. The method of claim 10, wherein the loop amplifier comprises an amplifier having adjustable gain, including setting a first gain during normal operation and a second increased gain in a calibration mode.

19. The method of claim 10, wherein the oscillator has an enabled mode and a low power mode.

* * * * *